(12) United States Patent
Nakazawa (10) Patent No.: US 7,781,341 B2
(45) Date of Patent: Aug. 24, 2010

(54) METHOD OF MANUFACTURING SEMICONDUCTOR DEVICE

(75) Inventor: Keisuke Nakazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 780 days.

(21) Appl. No.: 11/526,727

(22) Filed: Sep. 26, 2006

(65) Prior Publication Data

US 2007/0212894 A1     Sep. 13, 2007

(30) Foreign Application Priority Data

Mar. 9, 2006   (JP)   ............... 2006-064430

(51) Int. Cl.
*H01L 21/302*   (2006.01)
(52) U.S. Cl. ............ 438/691; 438/697; 438/700
(58) Field of Classification Search ............ None
See application file for complete search history.

(56) References Cited

U.S. PATENT DOCUMENTS

| | | | | |
|---|---|---|---|---|
| 6,291,109 | B1 * | 9/2001 | Suga et al. ............ 430/1 |
| 2003/0164113 | A1 | 9/2003 | Suzuki | |
| 2004/0072429 | A1 | 4/2004 | Hieda et al. | |
| 2005/0119402 | A1 | 6/2005 | Suzuki et al. | |
| 2006/0205165 | A1 | 9/2006 | Kawasaki et al. | |
| 2008/0102211 | A1 | 5/2008 | Matsuo et al. | |
| 2008/0234163 | A1 | 9/2008 | Shimizu et al. | |

FOREIGN PATENT DOCUMENTS

| | | | |
|---|---|---|---|
| JP | 2000-340557 | * | 8/2000 |
| JP | 2003-327908 | A | 11/2003 |
| JP | 3479648 | B2 | 12/2003 |
| JP | 3483500 | B2 | 1/2004 |
| JP | 2004-179614 | A | 6/2004 |
| WO | WO 02-088269 | A1 | 11/2002 |

* cited by examiner

*Primary Examiner*—Zandra Smith
*Assistant Examiner*—Pamela E Perkins
(74) *Attorney, Agent, or Firm*—Finnegan, Henderson, Farabow, Garrett & Dunner, L.L.P.

(57) ABSTRACT

A method for manufacturing a semiconductor device is provided, which includes feeding a coating liquid comprising a silicon-containing compound dissolved in a solvent onto a semiconductor substrate, revolving the semiconductor substrate to form a coated film containing the silicon-containing compound, feeding a rinsing liquid at least partially comprising α-pinene onto the underside of the semiconductor substrate to perform back-rinsing and washing of the underside of the semiconductor substrate, drying the semiconductor substrate that has been back-rinsed to remove the rinsing liquid, and heat-treating the semiconductor substrate to remove the solvent from the coated film to obtain an insulating film containing the silicon-containing compound.

20 Claims, 5 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2006-064430, filed Mar. 9, 2006, the entire contents of which are incorporated herein by reference.

BACKGROUND OF THE INVENTION

1. Field of the Invention

This invention relates to a method of manufacturing a semiconductor device, in particular, to a method of manufacturing a semiconductor device having a coated insulating film containing a silicon-containing compound.

2. Description of the Related Art

As for examples of the silicon-containing compound used for forming a coated insulating film, there are known siloxane and silazane. Any of these silicon-containing compounds are considered valuable as a material for low dielectric constant insulating (low-K) film or for interlayer dielectric (ILD) film, or as an embedding material. It is also proposed to use polysilazene as a material for pre-metal dielectric (PMD) or for inter-metal dielectric (IMD).

As for the solvent for dissolving siloxane for preparing a coating liquid, propylene glycol monomethyl ether (PGME), and propylene glycol monomethyl ether acetate (PGMEA) are frequently employed. These materials are employed also as a thinner (rinsing liquid) for wafer edge-cutting or for back-rinsing.

The rinsing liquid is selected depending on the kind of silicon-containing compound. For example, low molecular siloxane is employed for silsesquioxane; xylene, di-n-butyl ether or naphthalene-based materials are employed for polysilazane.

If a rinsing liquid low in vapor pressure (for example, naphthalene-based materials) is employed in wafer back-rinsing, when the wafer size is increased, the time to dry up the rinsing liquid is prolonged, thus retarding the treatment speed. Further, since raw materials of the conventional rinsing liquid are mostly derived from petroleum, carbon dioxide is inevitably generated on scrapping the rinsing liquid.

BRIEF SUMMARY OF THE INVENTION

A method for manufacturing a semiconductor device according to one aspect of the present invention comprises containing compound dissolved in a solvent onto a semiconductor substrate; revolving the semiconductor substrate to form a coated film containing the silicon-containing compound; feeding a rinsing liquid at least partially comprising α-pinene onto the underside of the semiconductor substrate to perform back-rinsing and washing of the underside of the semiconductor substrate; drying the semiconductor substrate that has been back-rinsed to remove the rinsing liquid; and heat-treating the semiconductor substrate to remove the solvent from the coated film to obtain an insulating film containing the silicon-containing compound.

A method for manufacturing a semiconductor device according to another aspect of the present invention comprises successively forming a gate insulating film, a first gate electrode film and a stopper film above a semiconductor substrate; forming an element-isolating trench having a depth penetrating through the gate insulating film, the first gate electrode film and the stopper film and reaching to the semiconductor substrate; feeding a coating liquid comprising a silicon-containing compound dissolved in a solvent onto the semiconductor substrate; revolving the semiconductor substrate to form a coated film containing the silicon-containing compound; feeding a rinsing liquid at least partially comprising α-pinene onto the underside of the semiconductor substrate to perform back-rinsing and washing of the underside of the semiconductor substrate; drying the semiconductor substrate that has been back-rinsed to remove the rinsing liquid; heat-treating the semiconductor substrate to remove the solvent from the coated film to obtain an insulating film containing the silicon-containing compound; subjecting the insulating film containing the silicon-containing compound to oxidizing treatment in an atmosphere comprising water vapor to turn the insulating film into a silicon dioxide film; removing a part of the silicon dioxide film deposited on the stopper film to selectively leave the silicon dioxide film in the element-isolating trench, thereby forming an element isolating insulating film; removing the stopper film to expose a surface of the first gate electrode film; removing an upper part of the element isolating insulating film to expose an upper part of side of the first gate electrode film; forming an interelectrode insulating film on the first gate electrode film having an exposed upper part of side as well as on the element isolating insulating film whose upper part has been removed; and forming a second gate electrode film on the interelectrode insulating film.

DETAILED DESCRIPTION OF THE INVENTION

Next, embodiments of the present invention will be explained with reference to drawings.

The flow in the coating step will be explained with reference to FIGS. 1 to 8.

Figure 1:
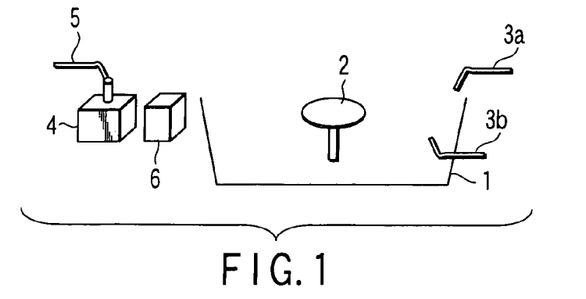
FIG. 1 is a cross-sectional view illustrating a step in the method of manufacturing a semiconductor device according one embodiment of the present invention.

In FIG. 1, the construction of a coater to be employed is shown therein. As shown in FIG. 1, a spin chuck 2 holding a semiconductor wafer (not shown) is disposed in a coater cup 1. The coater is further provided with an edge cut nozzle 3a and a back side rinsing nozzle 3b. A rinsing liquid is fed from these nozzles to a prescribed region of the semiconductor wafer. On the outside of the coater cup 1, a solvent bath 4 filled with a solvent as well as a dummy dispense port 6 for discarding the coating liquid are disposed. A chemicals nozzle 5 is employed for feeding the coating liquid (chemicals) to the semiconductor wafer. In FIG. 1, the chemicals nozzle 5 is kept introduced in a solvent vapor filled in the solvent bath 4 in order to prevent a distal end of the chemicals nozzle 5 from drying.

Figure 2:
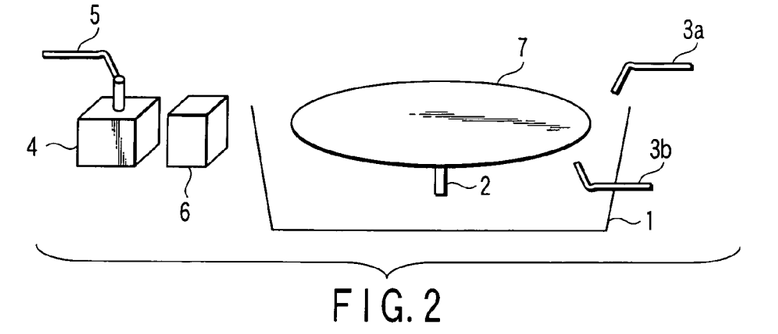
FIG. 2 is a cross-sectional view illustrating a step subsequent to the step shown in FIG. 1.

In the coating step, first of all, the semiconductor wafer 7 is held by the spin chuck 2 and fixed in place by vacuum adsorption. The wafer is mounted on a cooling plate (not shown) and conditioned so as to maintain the wafer at a constant temperature. The conditions at this time may be, for example, 23° C. maintained for 60 seconds.

Figure 3:
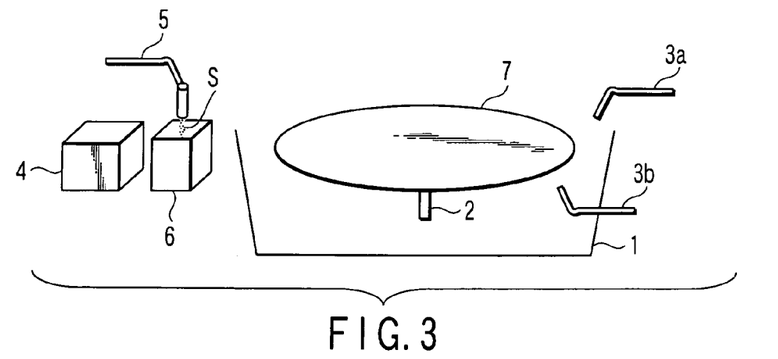
FIG. 3 is a cross-sectional view illustrating a step subsequent to the step shown in FIG. 2.

The coating liquid in the distal end of the chemicals nozzle 5 fluctuates in concentration due to a reaction thereof with water in air atmosphere. The concentration of the coating liquid also changes when the solvent thereof is evaporated. In order to avoid these phenomena, it is required to regulate the coater into such a condition that a fresh coating liquid can be fed immediately prior to the delivery thereof to the semiconductor wafer 7. Therefore, the chemicals nozzle 5 is designed to be moved to the dummy dispense port 6 as shown in FIG. 3, thereby enabling the coating liquid existing in the nozzle to be discarded (dummy dispense).

A distal end of the nozzle may be washed with a solvent prior to performing the dummy dispense. When wafers are to be continuously treated, this step may be omitted.

Figure 4:
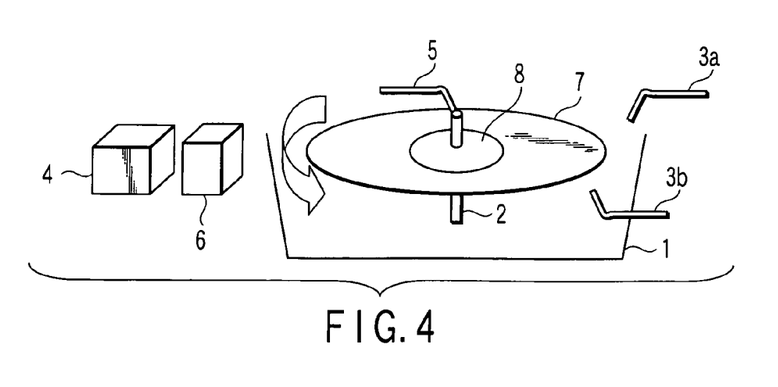
FIG. 4 is a cross-sectional view illustrating a step subsequent to the step shown in FIG. 3.

Subsequently, as shown in FIG. 4, the chemicals nozzle 5 is moved over the semiconductor wafer 7 and then the coating liquid is delivered to form a coated film 8. As for the method of delivery, it is possible to employ two kinds of system, i.e., a static system and a dynamic system. The static system is a system wherein a coating liquid is fed to a central portion of wafer which is kept in a static state. On the other hand, the dynamic system is a system wherein a coating liquid is fed while rotating the wafer. The dynamic dispense is widely employed, since a film excellent in uniformity of thickness can be formed with a small delivery quantity.

As for the coating liquid to be employed for forming the coated film 8, a silicon-containing compound is employed. This silicon-containing compound is represented, for example, by the following general formula (1).

(1)

wherein $R^1$, $R^2$ and $R^3$ may be the same or different and are individually a hydrogen atom or a substituent group including, for example, an alkyl group, alkoxy group, alkenyl group, hydroxyl group and amino group; and x, y and z are individually an integer of 0 or more.

When z=0 in the aforementioned general formula (1), the silicon-containing compound is a silane-based compound. Especially, when a hydrogen atom is introduced into both of $R^1$ and $R^2$, the silicon-containing compound is a silane compound. When y=0 in the aforementioned general formula (1), the silicon-containing compound is a silazane-based compound. Especially, when all of $R^1$, $R^2$ and $R^3$ are constituted by hydrogen atom, the silicon-containing compound is perhydropolysilazane.

Further, polysiloxane, silsesquioxane, polysilasilazane, etc., can also be employed.

The coating liquid can be prepared by dissolving the aforementioned silicon-containing compound in a solvent. The solvent may be selected in conformity with the kinds of the silicon-containing compound. The solvent can also be employed as a rinsing liquid to be fed from the edge cut nozzle 3a or from the back side rinsing nozzle 3b. Generally, when polysilazane is employed as the silicon-containing compound, xylene or di-n-butyl ether can be employed as a solvent.

Figure 5:
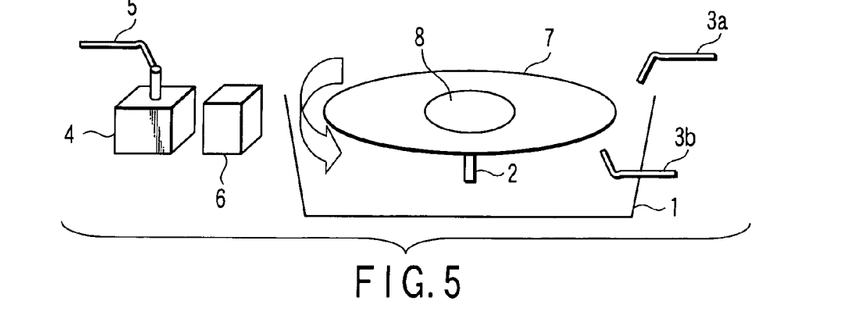
FIG. 5 is a cross-sectional view illustrating a step subsequent to the step shown in FIG. 4.

After finishing the delivery of coated liquid, the wafer 7 is rotated at a predetermined rotational speed as shown in FIG. 5 to regulate the film thickness of the coated film 8. The film thickness can be determined by the viscosity (concentration) of the coating liquid and also by the rotational speed. At this time, the chemicals nozzle 5 is moved back to the solvent bath 4 and kept there in a standby state.

Figure 6:
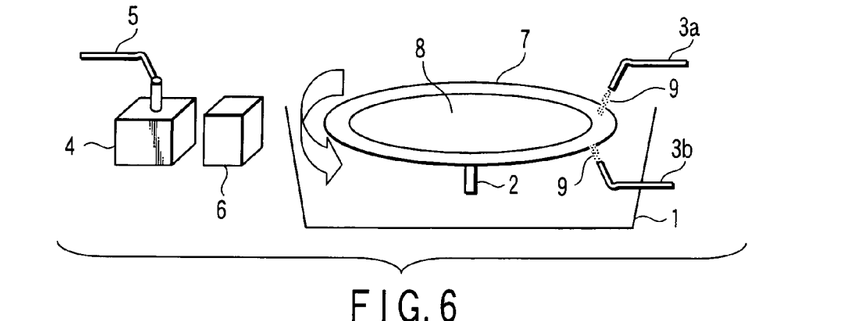
FIG. 6 is a cross-sectional view illustrating a step subsequent to the step shown in FIG. 5.

After the film thickness of the coated film 8 has been stabilized, edge bead removing (EBR)/back rinsing is performed. More specifically, as shown in FIG. 6, a rinsing liquid 9 is delivered from the edge cut nozzle 3a to remove the coated film formed on the edge of wafer, thus performing the edge cut. At this time, attention should be paid so as to prevent the edge of the coated film that has been contacted with the rinsing liquid 9 from being swelled or sagged. Further, concurrent with EBR, the rinsing liquid 9 is fed from the back side rinsing nozzle 3b to the underside of wafer to wash out the coated liquid that has been spread to the underside of wafer, thus performing the back rinsing.

Figure 7:
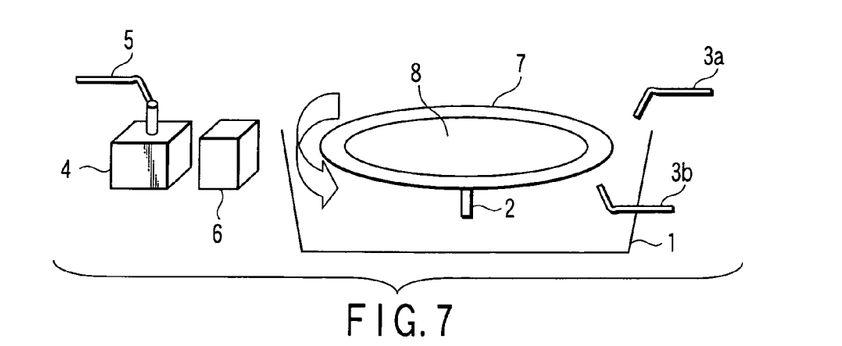
FIG. 7 is a cross-sectional view illustrating a step subsequent to the step shown in FIG. 6.

After finishing the EBR/back rinsing, the supply of the rinsing liquid is suspended as shown in FIG. 7 and then the wafer 7 is rotated to dry the edge and underside of the wafer 7. The time required to dry up the rinsing liquid is important as it is directly related to the throughput. Although a rinsing liquid having a high vapor pressure can be easily dried, the liquid having a high vapor pressure is low in flash point and is generally dangerous. Accordingly, it is preferable to select a rinsing liquid which is high in vapor pressure and is reliable in safety.

Figure 8:
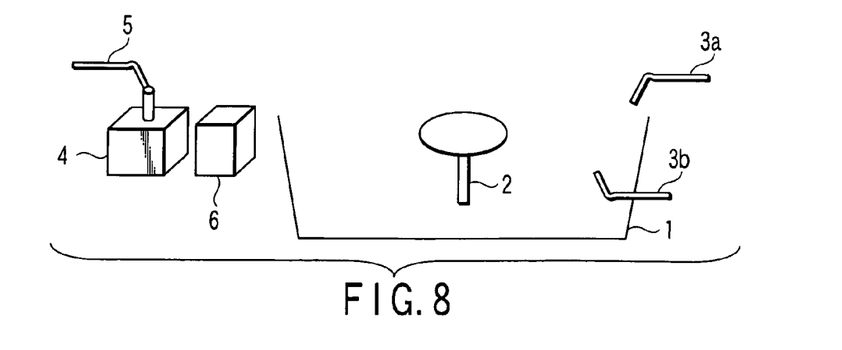
FIG. 8 is a cross-sectional view illustrating a step subsequent to the step shown in FIG. 7.

After finishing the drying process, the wafer 7 is removed from the coater as shown in FIG. 8 and transferred to a hot plate (not shown). Over this hot plate, the coated film is baked at a suitable temperature to dry the coated film. For example, the coated film is baked at a temperature of 150° C. for 180 seconds to remove the solvent from the coated film, thus forming a coated insulating film.

Subsequently, the wafer is cooled using a cooling plate, thus finishing a sequence of coating process. The cooling conditions at this time may be, for example, 23° C. and 60 seconds.

Incidentally, the solvent for the coating liquid as well as the rinsing liquid should be selected taking into consideration the compatibility thereof with a material employed in the coater. More specifically, it is desired to select a material which does not damage a coater cup or piping.

(Preliminary Experiment 1)

First of all, using several compounds as the rinsing liquid, the influences thereof on a coated film containing a silicon-containing compound were investigated. As for the silicon-containing compound, perhydropolysilazane (PHPS) (AZ Electronic Materials Co., Ltd.) was prepared. This silicon-containing compound was dissolved in di-n-butyl ether employed as a solvent to prepare a coating liquid.

As for the aforementioned several compounds, various terpenoids and derivatives thereof were employed. Generally, terpenoid can be derived from plants useful as a raw material. The material to be used as a solvent can be obtained as an essential oil. Specifically, α-pinene, d-limonene, 1,8-cineole, dipentene, p-menthane and p-cymene were prepared. Each of these compounds can be employed as a rinsing liquid as it is.

α-pinene can be obtained by distilling turpentine, the resultant α-pinene occasionally containing β-pinene or caffeine. When the purity of α-pinene is 75% or more, it can be called α-pinene. d-limonene can be derived from citrus fruits. 1,8-cineole is abundantly contained in eucalyptus. Dipentene is a mixture of isomers of limonene. Although p-menthane and p-cymene are also contained in various plants, they are generally industrially synthesized through the reformation of α-pinene or d-limonene.

Further, as controls, di-n-butyl ether and naphthalene-based solvent were prepared. The di-n-butyl ether is generally employed as a solvent for PHPS, and the naphthalene-based solvent is a compound which has been conventionally used as a rinsing liquid. The naphthalene-based solvent was used in the same manner as conventionally used.

For each of these compounds, the solubility, water content, EBR characteristics and drying characteristics thereof were investigated. The solubility was confirmed by mixing a solution of each of these compounds with the aforementioned coating liquid. If gelation or phase separation did not occur, the solubility was indicated by a mark of "○".

The water content was investigated according to Karl Fischer's method. When the water content was less than 0.1%, it was marked by "○" and when the water content was more than 0.4%, it was marked by "X". When the water content was within the range of 0.1% and 0.4%, it was marked by "Δ".

The EBR characteristics was determined by carrying out the following test. First of all, a PHPS coating liquid was coated on a wafer for 25 seconds while revolving the wafer at a rotational speed that would make the thickness of the coated layer become about 400 nm after the heat treatment thereof at a temperature of 150° C. for 3 minutes. Then, the wafer was rotated at a rotational speed of 1500 rpm, during which the rinsing liquid was dripped onto a surface region of the wafer which was located 2 mm away from the edge thereof, thus performing etch-back for 13 seconds. An edge of wafer was investigated by microscopic observation and using a step-measuring apparatus. When the magnitude of tailing was 0.3 mm or less, it was marked by "○" and when the magnitude of tailing was more than 0.3 mm, it was marked by "X"

The drying characteristics were determined by investigating the vapor pressure of the compounds at room temperature with reference to documents. When the vapor pressure was 1 hPa or more, it was marked by "X" and when the vapor pressure was less than 1 hPa, it was marked by "X".

The results thus obtained are summarized in the following Table 1. In the column of drying characteristics, the vapor pressure of each of compounds investigated is also indicated together with the assessment.

TABLE 1

| Compounds | Solubility | Water content | EBR characteristics | Drying characteristics As-sessment | Vapor pressure (hPa) |
|---|---|---|---|---|---|
| α-pinene | ○ | ○ | ○ | ○ | 5 |
| d-limonene | Gelation | ○ | ○ | ○ | 4 |
| 1,8-cineole | Gelation | Δ | ○ | ○ | 1.3 |
| Dipentene | ○ | Δ | X | ○ | 4 |
| p-menthane | ○ | ○ | ○ | ○ | 2.7 |
| p-cymene | ○ | ○ | ○ | ○ | 2 |
| Dibutyl ether | ○ | X | ○ | ○ | 17 |
| Naphthalene-base solvent | ○ | ○ | ○ | X | 0.1 |

As shown in Table 1 described above, d-limonene and 1,8-cineole among these terpenoids were found inappropriate due to the gelation thereof. It was assumed that because of large water content in the case of 1,8-cineole, a reaction occurred between this water content and the PHPS. It is desirable that the water content of compound that may become a cause for generating gelation as the compound is mixed with the PHPS coating liquid should be as low as possible. Although di-n-butyl ether is employed as a solvent, it should be subjected to dehydration treatment before use. In the case of d-limonene, since it contained oxygen-containing materials as impurities, the gelation presumably took place because of a reaction between the impurities and the PHPS.

With respect to the EBR characteristics, all of these compounds, except dipentene, were found excellent. Although a slight swelling of an edge of the PHPS film was admitted, the magnitude thereof was so small that it could be disregarded.

The drying characteristics are a criterion of drying time after the finishing of back-rinsing. Namely, the higher the vapor pressure is, the shorter the drying time would become. When the assessment of drying time was performed by revolving a 300 mm wafer at a rotational speed of 3000 rpm after the rinsing, a rotation time of about 25 seconds was needed in the case of the naphthalene-based compound (vapor pressure: 0.1 hPa). On the other hand, in the case of a liquid having a vapor pressure of about 10 hPa, the drying was accomplished within one second of rotation time.

In view of these results, three kinds of terpenoids, i.e. α-pinene, p-menthane and p-cymene were found useful as a rinsing liquid for PHPS in terms of solubility, EBR characteristics and drying characteristics.

Incidentally, the PHPS and the derivatives thereof may be reactive to alcohol, aldehyde, ketone, ester or carboxylic acid. Therefore, as long as these functional groups are eliminated, α-pinene, etc., can be used even if the PHPS or the derivatives thereof are employed as a solvent.

(Preliminary Experiment 2)

The aforementioned terpenoids were dissolved in hydrogen silsesquioxane to investigate the solubility thereof, the results being illustrated in the following Table 2.

TABLE 2

| Compounds | Solubility |
| --- | --- |
| α-pinene | ○ |
| d-limonene | Gelation |
| 1,8-cineole | ○ |
| Dipentene | ○ |
| p-menthane | Gelation |
| p-cymene | Gelation |

As shown in Table 2 described above, all of the terpenoids except α-pinene, 1,8-cineole and dipentene indicated a tendency of generating gelation. From these results, it will be recognized that α-pinene, 1,8-cineole and dipentene are useful as a solvent or a rinsing liquid for hydrogen silsesquioxane.

(Preliminary Experiment 3)

Next, the compatibility of these compounds with respect to the materials of coater was investigated. The portions of the coater that will be contacted with chemicals, such as chemicals tube and waste liquid tank, are mostly made of fluorinated resin or metals. Therefore, no problems would occur even if any of these compounds mentioned above are employed. However, only the coater cup is made of polypropylene (PP). Therefore, depending on the kind of the compound to be employed, swelling of this PP may be caused, thus deforming the coater cup. Accordingly, a dipping test was performed using a fragment of this coater cup to investigate the resistance of PP.

The resistance of PP (hereinafter referred to as PP resistance) was investigated based on the fluctuation of weight thereof. Namely, when the ratio of weight increase in a period of one month was less than 5%, it was marked by "○", when the ratio of weight increase during this period was between 5-10%, it was marked by "Δ", and when the ratio of weight increase during this period was more than 10%, it was marked by "X".

The results thus obtained are summarized in the following Table 3.

TABLE 3

| Compounds | PP Resistance |
| --- | --- |
| α-pinene | ○ |
| p-menthane | Δ |
| p-cymene | Δ |
| Dibutyl ether | X |
| Naphthalene-base solvent | ○ |

The above Table 3 indicates that α-pinene is capable of exhibiting the same degree of PP resistance as that of naphthalene-based solvent which has been conventionally employed as a rinsing liquid. Moreover, since this α-pinene is one of terpenoid and hence a natural substance existing in air atmosphere, it is advantageous in the following respects. Namely, it is possible to minimize the discharge of carbon dioxide and, since α-pinene does not contain any substance which is hazardous to the human body, it is reliable in safety.

Based on the results obtained from the above preliminary experiments, α-pinene was selected as a rinsing liquid in the following embodiments of the present invention. As already explained, although this α-pinene may contain β-pinene or caffeine, as long as the purity of α-pinene is 75% or more, the α-pinene can be employed as a rinsing liquid in the embodiments of the present invention. Namely, this rinsing liquid can be defined as a rinsing liquid which is at least partially constituted by α-pinene.

Embodiment 1

A combination of two kinds of rinsing liquids (naphthalene-based solvent and α-pinene) was employed for the EBR and the back-rinsing to investigate throughput and profitability. The throughput can be assessed by estimating the time required for performing the EBR and for the drying after the back-rinsing.

The throughput can be determined from the drying characteristics of the rinsing liquid. The higher the vapor pressure of the rinsing liquid is, the faster the drying speed of the rinsing liquid would become. Therefore, the vapor pressure of the rinsing liquid should preferably be 1 hPa or more. As long as the rinsing liquid has a vapor pressure of 1 hPa or more, the time required for drying the rinsing liquid after the step of back-rinsing can be shortened to 10 seconds or less. Whereas, when a naphthalene-based solvent which is inferior in drying characteristics is employed in the back-rinsing, the throughput would deteriorate.

However, since the width of edge-cutting is generally as small as 3 mm or so, even if naphthalene-based solvent is employed in the EBR, the influence of the solvent on the throughput would be negligible. When α-pinene is employed in the back-rinsing, the throughput can be substantially prevented from deteriorate, thus making it possible to secure the same degree of throughput as obtainable when α-pinene is employed for both of EBR/back-rinsing.

A combination of the rinsing liquids for the EBR/back-rinsing that makes the throughput highest would be a combination of α-pinene/α-pinene or a combination of a naphthalene-based solvent/α-pinene.

When two kinds of rinsing liquids, such as a combination of α-pinene and a naphthalene-based solvent, are employed, installation space for these two kinds of vessels is required to be provided. Furthermore, the layout of piping from a vessel to a nozzle or a compression mechanism (or a pump) for the rinsing liquid would be required to be installed for each of these two kinds of rinsing liquids, thus complicating the structure of rinsing system. The complication in structure of the rinsing system may lead to difficulties in the maintenance and inspection of the system. When the same kind of rinsing liquid is employed for these EBR and back-rinsing, the structure of the rinsing system would be simplified. In this case, the rinsing liquid to be placed in the solvent bath should more preferably be the same as that to be employed for EBR and back-rinsing.

When both of the throughput and the construction of system are taken into consideration, an optimum combination of rising liquid for EBR/back-rinsing would be a combination of α-pinene/α-pinene.

Embodiment 2

In this embodiment, α-d-pinene having a purity of 97% or more was employed as a rinsing liquid to form a coated insulating film comprising PHPS. As a coating liquid to be used in this case, a solution was prepared by dissolving the same kind of PHPS as employed in the aforementioned preliminary experiment 1 in di-n-butyl ether.

The process recipe for coating and the time required for each of the steps are shown in the following Table 4. First of all, as shown in FIG. 2, a wafer 7 is mounted on a spin chuck 2 provided inside a coater cup 1. Then, as shown in FIG. 3, a chemicals nozzle 5 is taken out of a solvent bath 4 and a dummy dispense (delivery) is performed for a short time, thus replacing the coating liquid existing in a distal end of nozzle by a flesh coating liquid. This flesh coating liquid is then delivered by applying a pressure to the interior of chemicals tube using a high-pressure gas or forcedly delivered using a liquid transfer pump. (In Table 4, details about this system are omitted.)

Then, as shown in FIG. 4, the wafer 7 is rotated at a rotational speed of 1200 rpm and, at the same time, the coating liquid is delivered onto the wafer 7 for two seconds. Additionally, the wafer 7 is rotated for a short time at a rotational speed of 100 rpm to form a coated film 8 all over the wafer 7 as shown in FIG. 5. The quantity of the coating liquid delivered was 1.5 mL. In order to obtain the coated film 8 having a desired film thickness, the wafer 7 is rotated at a desired rotational speed for 13 seconds. Then, the coated film 8 is allowed to dry through the evaporation of the solvent included therein to finally obtain a fixed film thickness. In order to obtain such a film thickness, it requires a certain time of rotation and the film thickness can be regulated by suitably changing the rotational speed. In the case of a 300 mm wafer, the rotational speed thereof should be regulated within the range of 500-4000 rpm.

In order to remove the coated liquid that has spread to an edge of wafer and also the underside thereof, the wafer 7 is subjected to EBR and back-rinsing. These treatments can be performed, as shown in FIG. 6, by feeding a rinsing liquid 9 from the edge cut nozzle 3a and the back side rinsing nozzle 3b to the edge and underside of wafer 7, respectively, while revolving the wafer 7 at an intermediate rotational speed. The flow rate of the rinsing liquid 9 may be confined within the range of about 10 to 100 mL/min. Finally, as shown in FIG. 7, the wafer 7 is rotated to dry up the rinsing liquid 9 that has been fed to the edge and underside of wafer 7. The rotational speed at this time may be 3000 rpm for example and the time for this rotation may be 5 seconds at most.

The total treatment time in the coating process was 45 seconds, or less than one minute, per wafer.

TABLE 4

| | Items | Time (sec.) | Rotational speed (rpm) |
|---|---|---|---|
| 1 | Charging of wafer/ washing of nozzle/ dummy dispense | 10 | 0 |
| 2 | Moving of nozzle | 1 | 1200 |
| 3 | Delivery of coating liquid | 2 | 1200 |
| 4 | Rotation of wafer | 1 | 100 |
| 5 | Regulation of film thickness | 13 | Optional |
| 6 | Moving of nozzle | 3 | Optional |
| 7 | EBR | 1.5 | 1000 |
| 8 | EBR, back-rinsing | 5 | 1000 |
| 9 | EBR | 2.5 | 1000 |
| 10 | Moving of nozzle | 0.5 | 1000 |
| 11 | Drying | 5 | 3000 |
| 12 | Discharging of wafer | 0.5 | 0 |

Incidentally, in the conventional process where a naphthalene-based solvent was employed as a rinsing liquid, it was confirmed that a drying time of 25 seconds or more was required in the drying process. Further, the total treatment time in the coating process was 65 seconds, or more than one minute, per wafer. Namely, it is possible, by employing α-pinene as the rinsing liquid 9, to shorten the treating time by 20 seconds per wafer as compared with the conventional process. Moreover, the total treating time can be shortened to not more than one minute per wafer.

Embodiment 3

Next, one embodiment of a shallow trench isolation (STI) embedding method will be explained. A process of manufacturing a memory cell of CMOS structure will be explained with reference to FIGS. 9 to 12.

First of all, a silicon dioxide film (about 10 nm in thickness) 11 is formed on the surface of a silicon substrate 10 by thermal oxidation method. Then, as a CMP stopper film, a silicon nitride film (about 200 nm in thickness) 12 is formed on the silicon dioxide film 11 by the vacuum CVD method. The film thickness to be formed on the substrate can be optionally altered. For example, the film thickness of the silicon nitride film 12 may be selected from the range of 100-300 nm.

Figure 9:
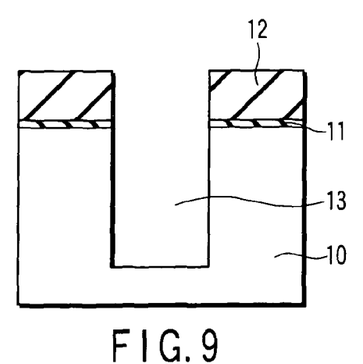
FIG. 9 is a cross-sectional view illustrating a step in the method of manufacturing a semiconductor device according another embodiment of the present invention.

By photolithography and the dry etching method, an element-isolating trench (STI trench) 13 having a depth penetrating through the CMP stopper film 12 and the silicon dioxide film 11 and reaching to the silicon substrate 10 is formed as shown in FIG. 9. The width and depth of the STI trench 13 may differ depending on the structure and the generation. Thus, the width of the STI trench 13 may typically be confined within the range of about 30 nm to 10 μm, and the depth of the STI trench 13 may typically be confined within the range of about 200 to 500 nm. However, the width and depth of the STI trench 13 may not be confined to the aforementioned ranges.

Next, a solution of PHPS is coated on the entire surface of the Si substrate 10 by the spin-coating method to form a coated film. At this time, in the same manner as in the case of aforementioned embodiment 1, using α-pinene, the back-rinsing of the underside of silicon substrate 10 and edge-cutting are performed. As already explained, by carrying out the back-rinsing using α-pinene, the drying time can be shortened and hence the treatment time can be shortened.

Figure 10:
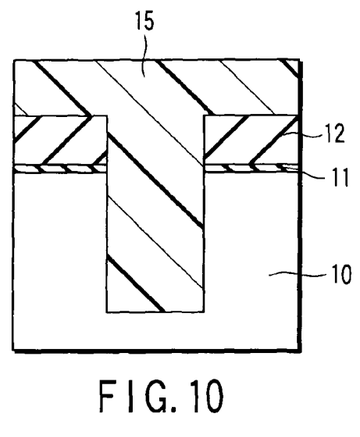
FIG. 10 is a cross-sectional view illustrating a step subsequent to the step shown in FIG. 9.

Incidentally, before forming the coated film, other kind of film such as a silicon dioxide film may be formed on the silicon nitride film 12. After the coated film has been formed, it is baked for 3 minutes at a temperature of 150° C. over a hot plate to evaporate and remove the solvent from the coated film, thereby forming a PHPS film 15 on the entire surface as shown in FIG. 10.

Figure 11:
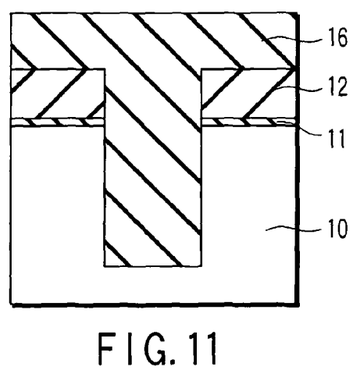
FIG. 11 is a cross-sectional view illustrating a step subsequent to the step shown in FIG. 10.

Then, the PHPS film 15 is subjected to an oxidation treatment in an atmosphere containing water vapor to convert it into a silicon dioxide film 16 as shown in FIG. 11. This oxidation treatment can be performed at a temperature ranging from 230° C. to 900° C. If the temperature is lower than 230° C., the silicon dioxide film to be obtained through the oxidation treatment of the PHPS film would become very porous. Because of this, such a silicon dioxide film may be easily etched away by a solution containing hydrofluoric acid, thus making it difficult to form an element isolating insulating film having a desired height. On the other hand, if the oxidation treatment is performed at a temperature exceeding 900° C. in an atmosphere containing water vapor, the side of the STI trench 13 may be oxidized too thick. In the worst case, dislocation may occur in the Si substrate 10, thus rendering the method inappropriate for use as a method for forming STI of the device of 100 nm class design rule.

Further, in order to stabilize the atmosphere and temperature inside a furnace, it is preferable that the oxidation time should be 5 minutes or more. However, if the oxidation is performed for an excessively long time, the side of the STI trench 13 may be oxidized too thick. Therefore, the upper limit of the oxidation time should preferably be confined within about 60 minutes.

Figure 12:
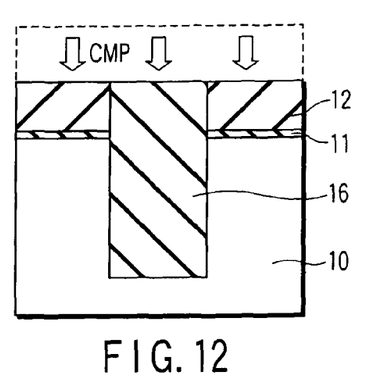
FIG. 12 is a cross-sectional view illustrating a step subsequent to the step shown in FIG. 11.

Subsequently, by CMP, etc., the silicon dioxide film 16 is selectively removed to expose the surface of the CMP stopper film 12 and to leave the silicon dioxide film 16 inside the STI trench 13 as shown in FIG. 12. As a result of these steps, an element isolating insulating film can be embedded inside the STI trench 13.

The silicon dioxide film 16 can be densified by heat-treating it at a temperature ranging from 700° C. to 1,100° C. in an inert gas atmosphere. If this heat-treating temperature is lower than 700° C., it would be difficult to sufficiently densify the silicon dioxide film 16. On the other hand, if this heat-treating temperature is higher than 1,100° C., the diffusion depth of the channel region that has been formed in advance by ion implantation may be further increased depending on the structure of semiconductor device. The heat treatment time may be optionally selected within the range of one second to 120 minutes. By performing the heat treatment under these conditions, water content can be removed from the silicon dioxide film 16, thereby making it possible to achieve the densification of the silicon dioxide film 16 and hence to enhance the electrical characteristics of the semiconductor device.

This densification may be performed before the CMP.

According to this embodiment, since the coated film can be formed with high throughput on embedding the element isolating insulating film inside the STI trench, it is possible to shorten the time required for the treatment.

Embodiment 4

Next, a process of manufacturing a memory cell of NAND structure will be explained with reference to FIGS. 13 to 17.

First of all, a gate insulation film (8 nm or less in thickness) 18 is formed on the surface of a silicon substrate 10 by thermal oxidation method. Then, as a first gate (floating gate) electrode film 19, a polycrystalline silicon film having a thickness of 100 nm is formed on the gate insulation film 18. This first gate electrode film 19 may be formed using WSi, CoSi, etc. other than polycrystalline silicon film. The film thickness of this first gate electrode film 19 may be optionally selected within the range of 100 to 200 nm. Then, as a CMP stopper film 12, a silicon nitride film (about 200 nm in thickness) is formed on first gate electrode film 19 by the vacuum CVD method. As for this CMP stopper film 12, it is also possible to employ a polycrystalline silicon film having a film thickness ranging from 100 to 200 nm or so in place of the aforementioned silicon nitride film.

Figure 13:
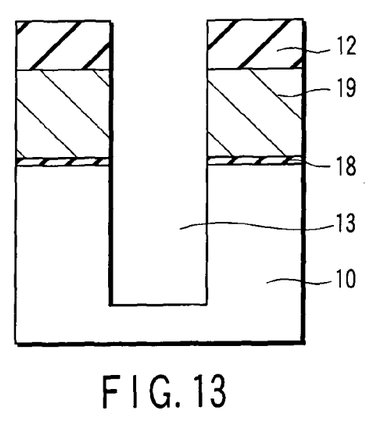
FIG. 13 is a cross-sectional view illustrating a step in the method of manufacturing a semiconductor device according a further embodiment of the present invention.

By photolithography and dry etching method, an STI trench 13 having a depth penetrating through the CMP stopper film 12, the first gate electrode film 19 and the gate insulating film 18 and reaching to the silicon substrate 10 is formed as shown in FIG. 13. The width and depth of the STI trench 13 may differ depending on the structure and the generation. Thus, the width of the STI trench 13 may typically be confined within the range of about 30 nm to 10 μm, and the depth of the STI trench 13 may typically be confined within the range of about 200 to 500 nm. However, the width and depth of the STI trench 13 may not be confined to these ranges.

Figure 14:
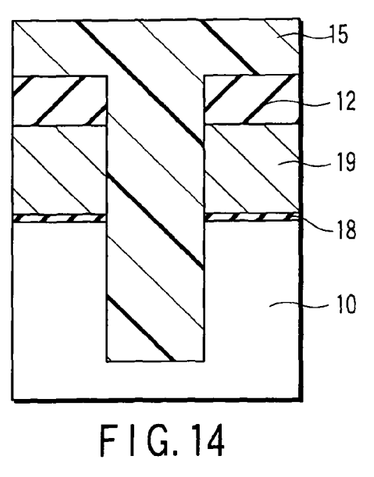
FIG. 14 is a cross-sectional view illustrating a step subsequent to the step shown in FIG. 13.
Figure 15:
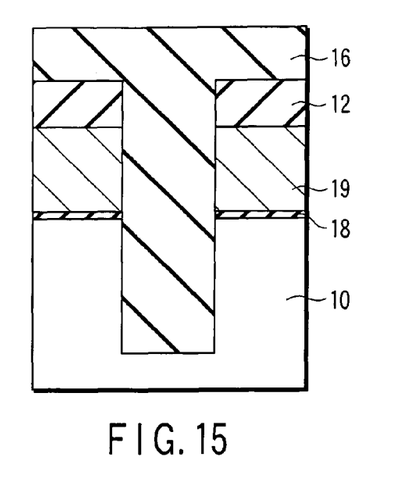
FIG. 15 is a cross-sectional view illustrating a step subsequent to the step shown in FIG. 14.

Next, a solution of PHPS is coated on the entire surface of the Si substrate 10 by the spin-coating method to form a coated film. At this time, in the same manner as in the case of aforementioned embodiment 1, using α-pinene, the back-rinsing of the underside of silicon substrate 10 and edge-cutting are performed. As already explained, by carrying out the back-rinsing using α-pinene, the drying time can be shortened and hence the treatment time can be shortened. In this manner, a PHPS film 15 as shown in FIG. 14 is formed and then subjected to an oxidation treatment in an atmosphere containing water vapor in the same manner as explained in the aforementioned Embodiment 3 to form a silicon dioxide film 16.

Figure 16:
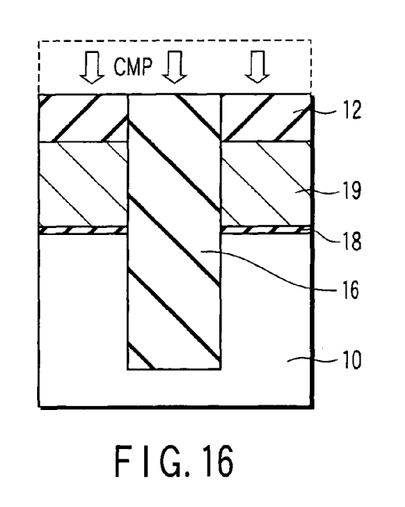
FIG. 16 is a cross-sectional view illustrating a step subsequent to the step shown in FIG. 15.

Subsequently, by CMP, etc., the silicon dioxide film 16 on the CMP stopper film 12 is selectively removed to expose the surface of the CMP stopper film 12 and to leave the silicon dioxide film 16 inside the STI trench 13 as shown in FIG. 16. As a result of these steps, the silicon dioxide film 16 can be embedded as an element isolating insulating film inside the STI trench 13.

The silicon dioxide film 16 can be densified by heat-treating it at a temperature ranging from 700° C. to 1,100° C. in an inert gas atmosphere in a step before or after the CMP thereof. If this heat-treating temperature is lower than 700° C., it would be difficult to sufficiently densify the silicon dioxide film 16. On the other hand, if this heat-treating temperature is higher than 1,100° C., the diffusion depth of the channel layer that has been formed in advance by ion implantation may be further increased depending on the structure of the semiconductor device. The heat treatment time may be optionally selected within the range of one second to 120 minutes. By performing the heat treatment under these conditions, water content can be removed from the silicon dioxide film 16, thereby making it possible to achieve the densification of the silicon dioxide film 16 and hence to enhance the electrical characteristics of the semiconductor device.

Figure 17:
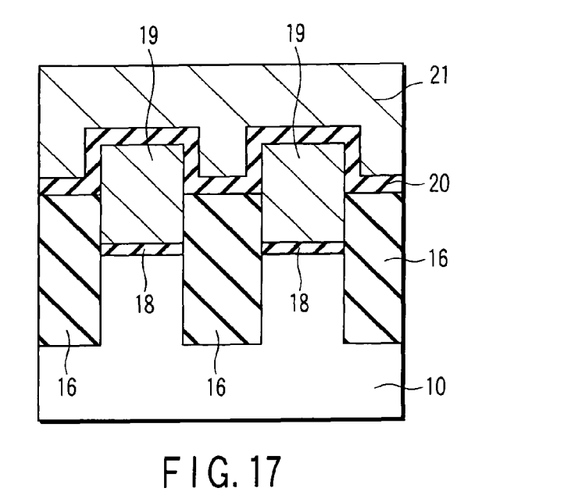
FIG. 17 is a cross-sectional view illustrating a step subsequent to the step shown in FIG. 16.

Next, the CMP stopper film 12 is removed by etching using a solution of phosphoric acid and then an upper part of the silicon dioxide film 16 is removed by etching using a dilute hydrofluoric acid. As a result, the upper part of the side of the first gate electrode film 19 is partially exposed in a range of about 100 nm. Then, an interelectrode insulating film 20 is deposited according to the ordinary method, and additionally, a second gate (control gate) electrode film 21 is deposited on this interelectrode insulating film 20 to obtain a memory cell of NAND structure as shown in FIG. 17. The interelectrode insulating film 20 can be formed by the CVD method using a lamination comprising a silicon oxide film/silicon nitride film/silicon oxide film (about 20 nm in total thickness). The second gate electrode film 21 can be formed by the CVD method using a lamination comprising a polycrystalline silicon film/tungsten film (about 50 nm in total thickness).

Then, the second gate electrode film 21 is subjected to RIE to perform the patterning of a word line. At this time, the floating gate is isolated for every memory cells. As a result, it is possible to create a laminate gate structure comprising the interelectrode insulating film 20 which is sandwiched between the floating gate and the control gate. Furthermore, an impurity is ion-implanted into the silicon substrate in a manner self-aligned with the laminate gate structure, thereby forming source/drain regions (not shown). In this manner, a semiconductor device having a memory cell transistor can be obtained.

According to this embodiment, since the coated film can be formed with high throughput on embedding the silicon dioxide film as an element isolating insulating film in the memory cell of NAND structure, it is possible to shorten the time required for the treatment.

Embodiment 5

Next, a process of forming pre-metal dielectric (PMD) using polysilazane (PSZ) will be explained with reference to FIGS. 18 to 22.

Figure 18:
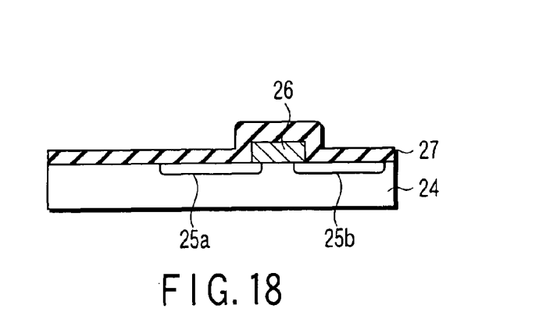
FIG. 18 is a cross-sectional view illustrating a step in the method of manufacturing a semiconductor device according a further embodiment of the present invention.

As shown in FIG. 18, an interlayer insulating film 27 is formed on the entire surface of a silicon substrate 24 having formed therein a transistor comprising impurity regions 25a and 25b and a gate electrode 26. Although not shown in FIG. 18, a gate electrode 26 is formed, via a gate insulating film (not shown), on the silicon substrate 24.

Figure 19:
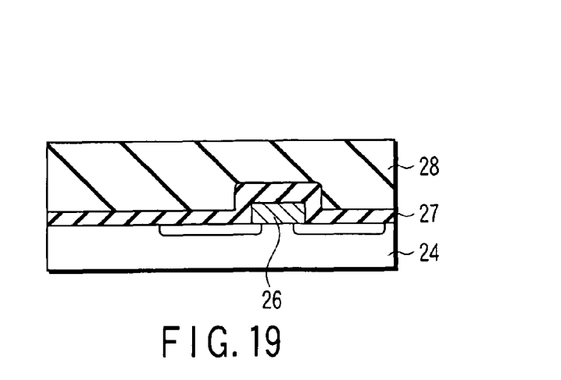
FIG. 19 is a cross-sectional view illustrating a step subsequent to the step shown in FIG. 18.

Meanwhile, polysilazane (PSZ) is dissolved in di-n-butyl ether employed as a solvent to prepare a coating liquid. This coating liquid is then coated on the entire surface of the substrate by the spin-coating method to form a coated film. At this time, in the same manner as in the case of aforementioned embodiment 1, using α-pinene, the back-rinsing of the underside of silicon substrate 10 and edge-cutting are performed. As already explained, by carrying out the back-rinsing using α-pinene, the drying time can be shortened and hence the treatment time can be shortened. After the coated film has been formed, it is baked over a hot plate to evaporate and remove the solvent from the coated film, thereby forming a PSZ film 28 as shown in FIG. 19.

A planarizing process by CMP may be omitted by preparing a coating liquid in a manner that makes it possible to obtain a planar coated surface as possible. Then, the PSZ film 28 is subjected to an oxidation treatment in an atmosphere containing water vapor to convert it into a silicon dioxide film 40. This oxidation treatment should preferably be performed at a temperature which does not cause the oxidation of the gate electrode, e.g., 600° C. or less. The silicon dioxide film 40 thus formed may be further subjected, subsequently, to annealing in an inert gas atmosphere in order to further promote the oxidation. It is also possible, for the purpose of planarizing the surface of the silicon dioxide film 40, to apply CMP to the silicon dioxide film 40.

Figure 20:
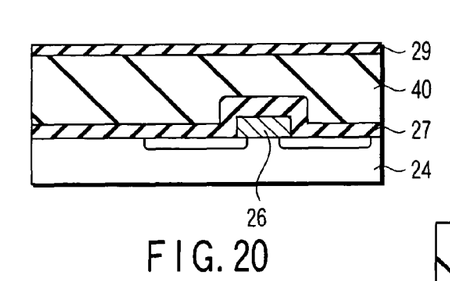
FIG. 20 is a cross-sectional view illustrating a step subsequent to the step shown in FIG. 19.

Then, as shown in FIG. 20, SiN film 29 is formed on the silicon dioxide film 40. This SiN film 29 acts as an etching stopper and may be deposited at a film thickness of about 200 nm by CVD, for instance.

Figure 21:
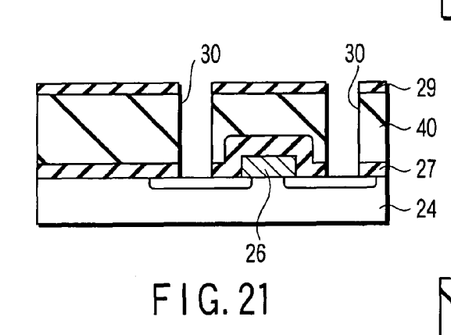
FIG. 21 is a cross-sectional view illustrating a step subsequent to the step shown in FIG. 20.

Subsequently, by following the ordinary method, the resultant substrate is subjected to lithography and RIE to form contact holes 30 each penetrating through the SiN film, the silicon dioxide film 40 and the interlayer insulating film 27 as shown in FIG. 21.

Figure 22:
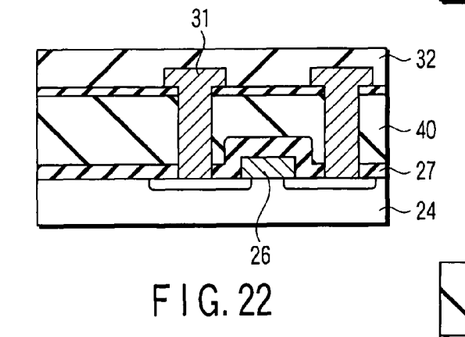
FIG. 22 is a cross-sectional view illustrating a step subsequent to the step shown in FIG. 21.

The contact holes 30 thus formed are respectively filled with a conductive material according to the ordinary method to form a metal wiring 31 as shown in FIG. 22. Furthermore, an interlayer insulating film 32 is deposited on the entire surface previously created.

According to this embodiment, since the coated film can be formed with high throughput on forming the PMD using polysilazane, it is possible to shorten the time required for the treatment.

Embodiment 6

Next, a process of forming inter-metal dielectric (IMD) using polysilazane (PSZ) will be explained with reference to FIGS. 23 to 25.

Figure 23:
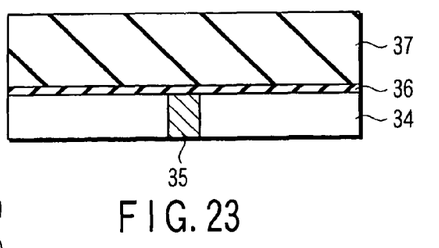
FIG. 23 is a cross-sectional view illustrating a step in the method of manufacturing a semiconductor device according a further embodiment of the present invention.

As shown in FIG. 23, a SiN film 36 and a PSZ film 37 are successively formed on a silicon substrate 34 having a metal wiring (for example, tungsten) 35. The deposition of the PSZ film 37 can be performed by the following method. Namely, the same kind of PSZ-coating liquid as employed in the previous Embodiment 5 is coated on the entire surface of the substrate by spin-coating method to form a coated film. On this occasion, in the same manner as in the case of aforementioned embodiment 1, using α-pinene, the back-rinsing of the underside of the silicon substrate 10 and edge-cutting are performed. As already explained, by carrying out the back-rinsing using α-pinene, the drying time can be shortened and hence the treatment time can be shortened.

After the coated film has been formed, it is baked over a hot plate to evaporate and remove the solvent from the coated film. Then, the PSZ film 37 is subjected to an oxidation treatment in an atmosphere containing water vapor to convert it into a silicon dioxide film 41. This oxidation treatment should preferably be performed at a low temperature which does not badly affect the wiring.

Figure 24:
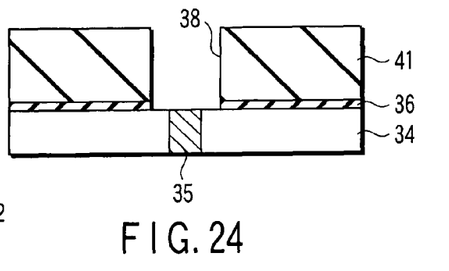
FIG. 24 is a cross-sectional view illustrating a step subsequent to the step shown in FIG. 23.

By following the ordinary method, the silicon dioxide film 41 thus formed is subjected to lithography and RIE to form contact holes 38 as shown in FIG. 24. Subsequently, the underlying SiN film 36 is etched away to expose the metal wiring 35.

Figure 25:
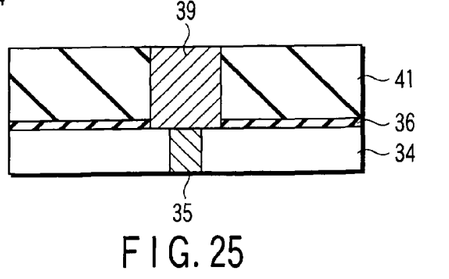
FIG. 25 is a cross-sectional view illustrating a step subsequent to the step shown in FIG. 24.

The contact holes 38 thus formed are respectively filled with a metal (for example, Al) according to the ordinary method to form a metal wiring 39 as shown in FIG. 25.

According to this embodiment, since the coated film can be formed with high throughput on forming the IMD using polysilazane, it is possible to shorten the time required for the treatment.

According to one aspect of the present invention, it is possible to provide a method of manufacturing a semiconductor device, which makes it possible to form, by coating method, an insulating film at a high throughput while minimizing the discharge of carbon dioxide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

feeding a coating liquid comprising a silicon-containing compound dissolved in a solvent onto a semiconductor substrate;

revolving the semiconductor substrate to form a coated film containing the silicon-containing compound;

feeding a rinsing liquid at least partially comprising α-pinene onto the underside of the semiconductor substrate to perform back-rinsing and washing of the underside of the semiconductor substrate;

drying the semiconductor substrate that has been back-rinsed to remove the rinsing liquid; and heat-treating the semiconductor substrate to remove the solvent from the coated film to obtain an insulating film containing the silicon-containing compound.

2. The method according to claim 1, wherein the silicon-containing compound is a compound represented by the following general formula (1):

$$—[(SiR^1R^2)_{x+1}O_y(NR^3)_z]— \quad (1)$$

wherein $R^1$, $R^2$ and $R^3$ may be the same or different and are individually a group selected from the group consisting of a hydrogen atom, alkyl group, alkoxy group, alkenyl group, hydroxyl group and amino group; and x, y and z are individually an integer of 0 or more.

3. The method according to claim 1, wherein the solvent is a compound selected from the group consisting of propylene glycol monomethyl ether, propylene glycol monomethyl ether acetate, xylene and di-n-butyl ether.

4. The method according to claim 1, further comprising feeding a rinsing liquid at least partially comprising α-pinene to an edge of the semiconductor substrate having the coated film formed thereon to carry out edge-cutting of the edge.

5. The method according to claim 1, further comprising subjecting the insulating film containing the silicon-containing compound to oxidizing treatment in an atmosphere comprising water vapor to turn the insulating film into a silicon dioxide film.

6. The method according to claim 1, further comprising heat-treating the silicon dioxide film in an inert gas atmosphere to densify the silicon dioxide film.

7. The method according to claim 1, further comprising forming a trench in the semiconductor substrate before feeding the coating liquid onto the semiconductor substrate, thereby filling the trench with the insulating film.

8. The method according to claim 1, further comprising:
    forming a semiconductor element including an impurity region and a gate electrode in the semiconductor substrate before feeding the coating liquid onto the semiconductor substrate;
    forming a through-hole in the insulating film to expose the impurity region; and
    filling the through-hole with a conductive material.

9. The method according to claim 1, further comprising:
    forming a first wiring on the semiconductor substrate before feeding the coating liquid onto the semiconductor substrate;
    forming a through-hole in the insulating film to expose the first wiring; and
    filling the through-hole with a conductive material to form a second wiring.

10. A method for manufacturing a semiconductor device comprising:
    successively forming a gate insulating film, a first gate electrode film and a stopper film above a semiconductor substrate;
    forming an element-isolating trench having a depth penetrating through the gate insulating film, the first gate electrode film and the stopper film and reaching to the semiconductor substrate;
    feeding a coating liquid comprising a silicon-containing compound dissolved in a solvent onto the semiconductor substrate;
    revolving the semiconductor substrate to form a coated film containing the silicon-containing compound;
    feeding a rinsing liquid at least partially comprising α-pinene onto the underside of the semiconductor substrate to perform back-rinsing and washing of the underside of the semiconductor substrate;
    drying the semiconductor substrate that has been back-rinsed to remove the rinsing liquid;
    heat-treating the semiconductor substrate to remove the solvent from the coated film to obtain an insulating film containing the silicon-containing compound;
    subjecting the insulating film containing the silicon-containing compound to oxidizing treatment in an atmosphere comprising water vapor to turn the insulating film into a silicon dioxide film;
    removing a part of the silicon dioxide film deposited on the stopper film to selectively leave the silicon dioxide film in the element-isolating trench, thereby forming an element isolating insulating film;
    removing the stopper film to expose a surface of the first gate electrode film;
    removing an upper part of the element isolating insulating film to expose an upper part of side of the first gate electrode film;
    forming an interelectrode insulating film on the first gate electrode film having an exposed upper part of side as well as on the element isolating insulating film whose upper part has been removed; and
    forming a second gate electrode film on the interelectrode insulating film.

11. The method according to claim 10, wherein the first gate electrode film is formed using a material selected from the group consisting of polycrystalline silicon, WSi and CoSi.

12. The method according to claim 10, wherein the silicon-containing compound is a compound represented by the following general formula (1):

—[(SiR¹R²)ₓ₊₁Oy(NR³)z]—(1)

wherein R¹, R² and R³ may be the same or different and are individually a group selected from the group consisting of s hydrogen atom, alkyl group, alkoxy group, alkenyl group, hydroxyl group and amino group; and x, y and z are individually an integer of 0 or more.

13. The method according to claim 10, wherein the solvent is a compound selected from the group consisting of propylene glycol monomethyl ether, propylene glycol monomethyl ether acetate, xylene and di-n-butyl ether.

14. The method according to claim 10, further comprising feeding a rinsing liquid at least partially comprising α-pinene to an edge of the semiconductor substrate having the coated film formed thereon to carry out edge-cutting of the edge.

15. The method according to claim 10, wherein the oxidizing treatment of the insulating film containing the silicon compound is performed at a temperature ranging from 230° C. to 900° C.

16. The method according to claim 10, wherein removing the silicon dioxide film existing on the stopper film is carried out by CMP.

17. The method according to claim 10, further comprising heat-treating the silicon dioxide film in an inert gas atmosphere to densify the silicon dioxide film.

18. The method according to claim 17, wherein the heat treatment is performed at a temperature ranging from 700° C. to 1,100° C.

19. The method according to claim 17, wherein the heat treatment is performed before removing the silicon dioxide film existing on the stopper film.

20. The method according to claim 17, wherein the heat treatment is performed after removing the silicon dioxide film existing on the stopper film.

* * * * *

UNITED STATES PATENT AND TRADEMARK OFFICE
CERTIFICATE OF CORRECTION

PATENT NO. : 7,781,341 B2
APPLICATION NO. : 11/526727
DATED : August 24, 2010
INVENTOR(S) : Nakazawa

It is certified that error appears in the above-identified patent and that said Letters Patent is hereby corrected as shown below:

* Claim 12, column 16, line 27, change "-[(SiR$^1$R$^2$)$_{x+1}$ O$_y$(NR$^3$)$_z$]-(l)" to -- - [(SiR$^1$R$^2$)$_{x+1}$ O$_y$(NR$^3$)$_z$]-    (1)--.

Claim 12, column 16, line 30, change "s hydrogen" to --a hydrogen--.

Signed and Sealed this

Seventh Day of December, 2010

David J. Kappos
*Director of the United States Patent and Trademark Office*